United States Patent [19]
Takahashi

[11] Patent Number: 4,745,594
[45] Date of Patent: May 17, 1988

[54] OFFSET-COMPENSATED SWITCHED-CAPACITOR FILTER FOR TDM MULTICHANNEL ANALOG SIGNALS

[75] Inventor: Yutaka Takahashi, Tokyo, Japan

[73] Assignee: NEC Corporation, Tokyo, Japan

[21] Appl. No.: 10,432

[22] Filed: Feb. 3, 1987

[30] Foreign Application Priority Data

Feb. 3, 1986 [JP] Japan ................................. 61-22281

[51] Int. Cl.$^4$ ................................................ H04J 3/20
[52] U.S. Cl. ........................................ 370/51; 370/77
[58] Field of Search ...................... 370/51, 52, 77, 114

[56] References Cited

U.S. PATENT DOCUMENTS

3,761,624  9/1973  Lewis et al. ............................ 370/52
4,244,030  1/1981  Albarello .............................. 370/77

OTHER PUBLICATIONS

Gregorian et al., "Switched-Capacitor Circuit Design", Processings of The IEEE, vol. 71, No. 8, Aug. 1983, p. 955, FIG. 32.

*Primary Examiner*—Douglas W. Olms
*Assistant Examiner*—James E. Busch
*Attorney, Agent, or Firm*—Foley & Lardner, Schwartz, Jeffery, Schwaab, Mack, Blumenthal & Evans

[57] ABSTRACT

For adaptive line equalization of a time-division multiplexed analog signal, an offset-compensated filter circuit comprises a timing circuit for generating channel-switching signals respectively synchronized with the time slots of the TDM signal. A switched-capacitor filter comprising an operational amplifier and a switched-capacitor circuit is responsive to the channel-switching signals for sequentially establishing transfer functions specific to the time slots of the TDM signal. A plurality of switched-capacitor DC decoupling circuits are connected to the output of the switched-capacitor filter. These DC decoupling circuits are respectively associated with the channel-switching signals for coupling a respective one of the filtered components to an input terminal of a summing amplifier. Each of the DC decoupling circuits has a first and a second capacitor and switches responsive to the presence of the associated channel-switching signal for charging the first capacitor with a voltage developed at the output terminal of the switched capacitor filter and charging the second capacitor with a voltage developed between the output of the switched capacitor filter and the input terminal of the summing amplifier and discharging the first and second capacitors in response to the absence of the associated channel-switching signal. The operational amplifier offset voltage and clock feedthrough of the switched-capacitor filter are eliminated.

4 Claims, 2 Drawing Sheets

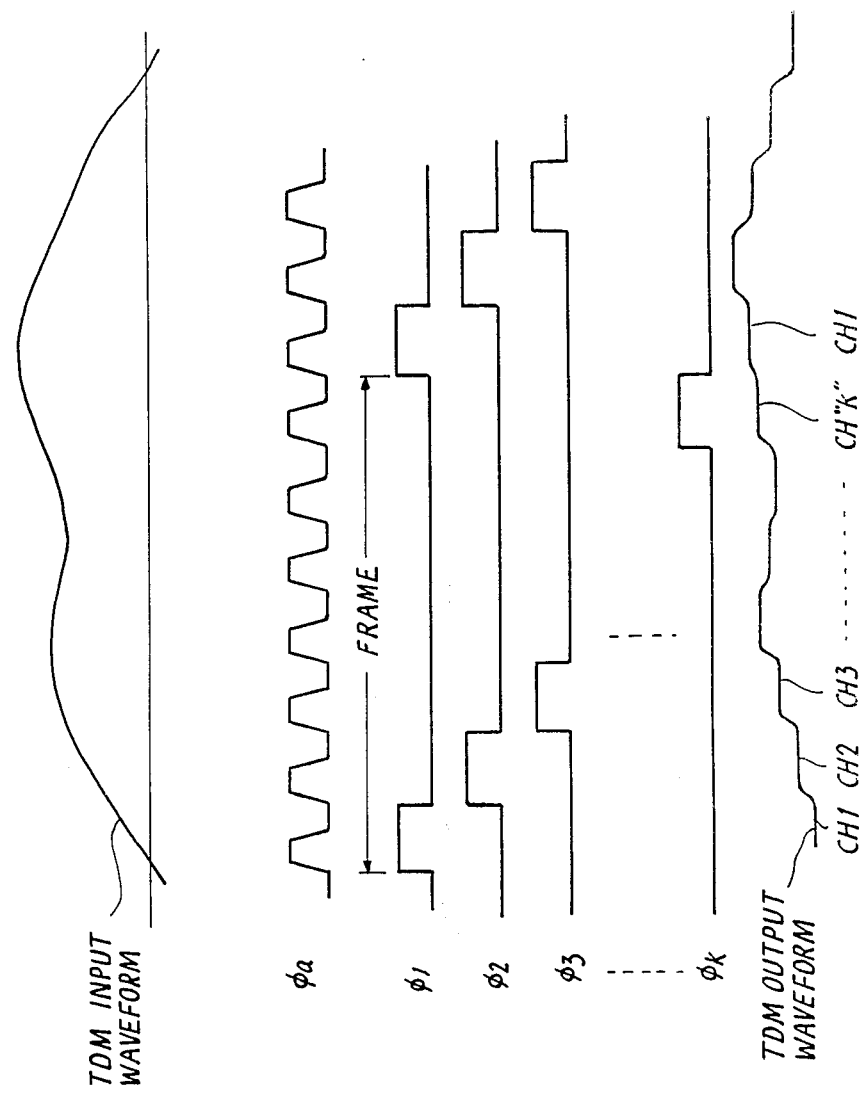

OFFSET-COMPENSATED SWITCHED-CAPACITOR FILTER FOR TDM MULTICHANNEL ANALOG SIGNALS

RELATED APPLICATION

The present invention is related to copending U.S. patent application Ser. No. 834,682, filed Feb. 28, 1986 by K. Nakayama, titled "Switched-Capacitor Adaptive Line Equalizer" and assigned to the same assignee as the present invention.

BACKGROUND OF THE INVENTION

The present invention relates to a switched-capacitor filter, and more specifically to an offset-compensated switched-capacitor filter for TDM (time-division multiplexed) multi-channel analog signals for adaptive line equalization. The present invention is particularly suitable for application to subscriber line equalization of time division multiplexed analog signals in a digital communications network such as ISDN (Integrated Services Digital Network).

Switched-capacitor technique is currently employed to implement a filter with an operational amplifier, MOS (metal oxide semiconductor) switches and capacitors to take advantage of its excellent adaptability to fabrication of integrated circuits. In the design of switched-capacitor filters an undesirable offset component arises from the offset voltage of the operational amplifier and the clock feedthrough of the switched-capacitor filter. A voltage amplifier with offset compensation as described in Proceedings of the IEEE, "Switched-Capacitor Circuit Design", Vol. 71, No. 8 Aug. 1983, page 955, FIG. 32, is suitable for such purposes.

However, if it is desired to process TDM multi-channel analog signals through a switched-capacitor filter for automatic line equalization, a sample-and-hold circuit would be required for each channel to detect the offset component from each channel to subtract it from the output of the switched-capacitor filter. As a result, a low-pass filter would be needed for each channel for filtering out the high-frequency noise of the switched-capacitor filter which has been introduced to the sample-and-hold circuit. Since the low-pass filter must have a low cut-off frequency if the frequencies of the TDM analog signals are relatively low, the resistor and capacitor components of such low-pass filter would account for a substantial proportion of the switched-capacitor circuit. As a result, a large circuit size would be required for integration. A particular disadvantage is that low-pass filters of this type cannot be implemented by integrated circuit technology.

SUMMARY OF THE INVENTION

Accordingly, an object of the present invention is to provide an offset-compensated switched-capacitor filter for TDM multichannel analog signals which is suitable for integrated circuit implementation.

According to the present invention, the offset-compensated filter circuit comprises a timing circuit for generating a plurality of channel-switching signals respectively synchronized with time slots of a TDM multichannel analog signal. The TDM signal is applied to an input of a switched-capacitor filter which is responsive to the channel-switching signals for establishing a transfer function between the input terminal and an output terminal. A plurality of switched-capacitor DC decoupling circuits are connected to the output of the switched-capacitor filter. These DC decoupling circuits are respectively associated with the channel-switching signals for coupling the output of the switched-capacitor filter to an input terminal of a summing amplifier. Each of the DC decoupling circuits comprises a first and a second capacitor and switch means responsive to the presence of the associated channel-switching signal for charging the first capacitor with a voltage developed at the output terminal of the switched-capacitor filter and charging the second capacitor with a voltage developed between the output of the switched-capacitor filter and the input terminal of the summing amplifier and discharging the first and second capacitors in response to the absence of the associated channel-switching signal. Preferably, the second capacitor has a greater capacitance value than the capacitance value of the first capacitor. The switched-capacitor filter preferably has a plurality of transfer functions specific to the channels of the TDM signal to sequentially establish the transfer functions in response to the channel-switching signals.

BRIEF DESCRIPTION OF THE DRAWINGS

The present invention will be described in detail with reference to the accompanying drawings, in which:

FIG. 2 is a view of clock waveforms used in the circuit of FIG. 1.

DETAILED DESCRIPTION

Figure 1:
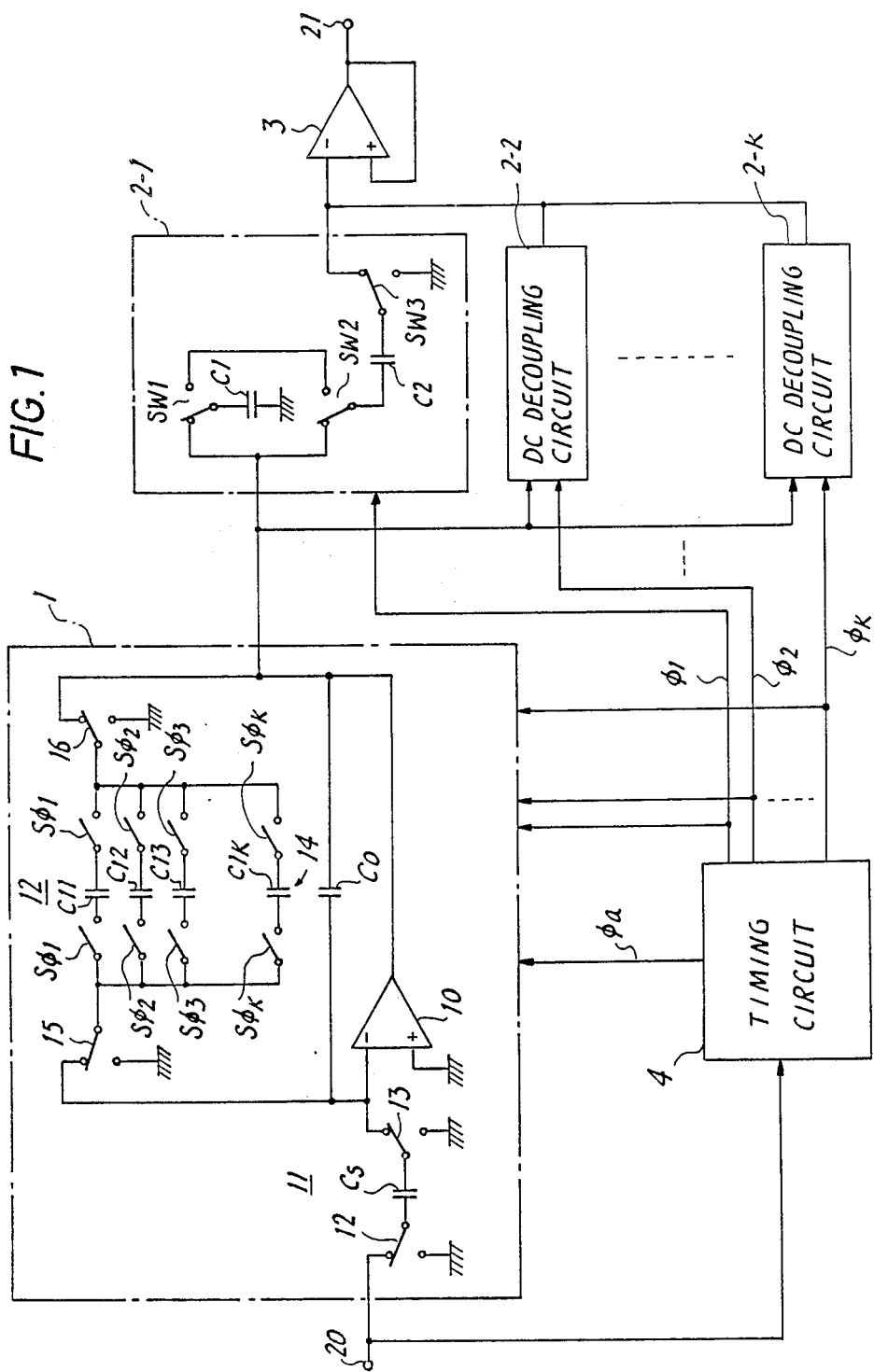
FIG. 1 is a circuit diagram of a switched-capacitor filter according to an embodiment of the present invention.

In FIG. 1, multi-channel analog signals are time-division multiplexed on specific time slots of a frame and applied as an analog TDM signal at input terminal 20 to a switched-capacitor filter 1 having a plurality of transfer functions respectively for "k" channel signals. The input signal is also applied to a timing circuit 4 to derive timing signals. A plurality of switched-capacitor DC decoupling circuits 2-1 through 2-k are provided in number corresponding to the number of channels of the TDM signal. Switched-capacitor DC decoupling circuits 2 have their input terminals connected together to the output of switched-capacitor filter 1, their output terminals being connected together to the noninverting input of an operational amplifier 3 which acts as a summing amplifier.

Timing circuit 4 generates a plurality of channel-switching signals $\phi_1$ to $\phi_k$ and a series of capacitor-switching pulses $\phi_a$. The channel-switching signals correspond respectively to the time slots of the TDM signal. Each of these switching signals has a pulse which is time-coincident with the associated time slot of the TDM frame as shown in FIG. 2. In the illustrated embodiment, the capacitor switching pulses $\phi_a$ have a 50% duty ratio to permit the switched-capacitor filter 1 to perform charge and discharge actions during each time slot of the TDM signal.

Switched-capacitor filter 1 comprises an operational amplifier 10 having a noninverting input coupled to ground and an inverting input coupled through a first switched-capacitor circuit 11 to the input terminal 20. Between the output and inverting input of the operational amplifier 10 is connected a second switched-capacitor circuit 12 and a fixed capacitor Co connected in parallel therewith. First switched-capacitor circuit 11 comprises a capacitor Cs having one terminal connected alternately to the input terminal 20 and ground by an electronic transfer switch 12 in response to the capacitor switching pulse $\phi_a$, the opposite terminal of capacitor Cs being alternately coupled to the inverting input of operational amplifier 10 and ground by an electronic transfer switch 13 in response to the capacitor-switching pulse $\phi_a$. Second switched-capacitor circuit 12 comprises a variable capacitance circuit 14 formed by a plurality of capacitors $C_{11}$, $C_{12}$, $C_{13}$ to $C_{1k}$ corresponding respectively to the time slots of the TDM signal, and a plurality of electronic switches $S\phi_1$ to $S\phi_k$ in pairs. A first terminal of capacitor $C_{11}$ is connected by one of the switches $S\phi_1$ to an electronic transfer switch 15 and a second, opposite terminal of capacitor $C_{11}$ is connected by the other of the switches $S\phi_1$ to an electronic switch 16. Likewise, capacitors $C_{12}$ through $C_{1k}$ are connected by corresponding pairs of switches $S\phi_2$ to $S\phi_k$ between switches 15 and 16. Switches 15 and 16 are responsive to the capacitor-switching pulses $\phi_a$ to alternately couple the capacitor circuit 14 into a parallel circuit relation with the capacitor Co and to ground.

Within a given time slot, switches 12, 13, 15 and 16 close their paths in response to the capacitor-switching pulse $\phi_a$ while one of the channel-associated switches $S\phi_1$ through $S\phi_k$ close their paths in response to an associated one of the channel-switching pulses $\phi_1$ to $\phi_k$.

Thereerefore, the switched-capacitor filter 1 has the following transfer functions respectively for the first through k-th channels:

$$H_1(z) = \frac{C_s Z^{-1}}{(Co + C_{11}) - Co\, Z^{-1}}$$

$$H_2(z) = \frac{C_s Z^{-1}}{(Co + C_{12}) - Co\, Z^{-1}}$$

$$H_3(z) = \frac{C_s Z^{-1}}{(Co + C_{13}) - Co\, Z^{-1}}$$

$$\vdots$$

$$H_k(z) = \frac{C_s Z^{-1}}{(Co + C_{1k}) - Co\, Z^{-1}}$$

The channel switching pulses $\phi_1$ through $\phi_k$ are further applied respectively to associated DC decoupling circuits 2-l to 2-k to enable them to sequentially provide switched-capacitor actions between the output of filter 1 and the inverting input of the operational amplifier 3 so that DC decoupling circuit 2-l, for example, provides a switched connection of the first time slot of the TDM signal from the output of filter 1 to amplifier 3.

Each of the switched-capacitor DC decoupling circuits 2 comprises a first capacitor $C_1$, a second capacitor $C_2$ and a switching circuit comprising first, second and third electronic transfer switches $SW_1$, $SW_2$ and $SW_3$. These electronic switches are responsive to the associated channel-switching pulse to establish a circuit that causes the capacitor $C_1$ to be charged with a voltage developed at the output of SC filter 1 and a circuit that causes the capacitor $C_2$ to be charged with a voltage developed between the output of SC filter 1 and the noninverting input of amplifier 3 and are responsive to the absence of the associated channel-switching signal to establish a circuit that causes the first and second capacitors to be discharged. Specifically, the switch $SW_1$ connects the first capacitor $C_1$ across the output of filter 1 and ground in response to the channel-switching pulse and the switches $SW_2$ and $SW_3$ connect the second capacitor $C_2$ between the output of filter 1 and the input of amplifier 3 in response to the channel-switching pulse, and switches $SW_1$, $SW_2$ and $SW_3$ connect these capacitors to ground during the absence of the channel-switching pulse.

The following is a quantative analysis of the DC decoupling circuit 2-l which is associated with the first time slot. Let $V_1(t_n)$ represent the voltage at the output of switched capacitor filter 1, $V_2(t_n)$ represent the voltage across the capacitor $C_2$, and $V_3(t_n)$ represent the voltage at the noninverting input of the operational amplifier 3, where $t_n$ represents n-th frame. From the foregoing operation, the following relations hold:

$$V_3(t_n) = V_1(t_n) - V_2(t_n) \tag{1}$$

$$C_1 V_1(t_n) + C_2 V_2(t_n) = (C_1 + C_2) V_2(t_{n+1}) \tag{2}$$

Using z-transformation, the transfer function H(z) of the DC decoupling circuit 2-l is given by:

$$H(z) = \frac{V_3}{V_1} = \frac{1 - z^{-1}}{1 - \beta z^{-1}} \tag{3}$$

where, $\beta$ is $C_2/(C_1+C_2)$. Since H(1)=0 at z=1 which gives DC component, Equation 3 represents a DC decoupling characteristic. The transfer function H(1) has a zero frequency if $\beta$ approaches a unity value. This can be realized by selecting a capacitor $C_2$ having a much greater capacitance value than that of capacitor $C_1$.

In this way, each of the DC decoupling circuits 2 eliminates the offset component caused by the operational amplifier 10 and clock feedthrough of the switched-capacitor filter 1 in the neighborhood of zero frequency from the associated channel and supplies its output to the summing amplifier 3 which combines the serial inputs into a time-division multiplexed signal for coupling to an output terminal 21.

The foregoing description shows only one preferred embodiments of the present invention. Various modifications are apparent to those skilled in the art without departing from the scope of the present invention which is only limited by the appended claims. Therefore, the embodiment shown and described is only illustrative, not restrictive.

What is claimed is:

1. An offset-compensated filter circuit for a time division multiplexed (TDM) signal having multichannel analog signal components assigned on different time slots, comprising:
   a timing circuit for generating a plurality of channel-switching signals respectively synchronized with said time slots;
   a switched-capacitor filter having an input terminal to which said TDM signal is applied and an output terminal, said switched-capacitor filter including an operational amplifier and a switched-capacitor circuit for establishing a transfer function between said input and output terminals.
   a summing amplifier; and
   a plurality of switched-capacitor DC decoupling circuits respectively associated with said channel-switching signals for coupling the output of said switched-capacitor filter to an input terminal of said summing amplifier, each of said DC decoupling circuits comprising a first and a second capacitor and switch means responsive to the presence of the associated channel-switching signal for charging said first capacitor with a voltage developed at the output terminal of said switched-capacitor filter and charging said second capacitor with a voltage developed between the output of said switched-capacitor filter and the input terminal of said summing amplifier and discharging said first and second capacitors in response to the absence of said associated channel-switching signal.

2. An offset-compensated filter circuit as claimed in claim 1, wherein said switched-capacitor filter has a plurality of transfer functions respectively associated with said time slots and is responsive to said channel-switching signals for sequentially establishing said transfer functions between said input and output terminals.

3. An offset-compensated filter circuit as claimed in claim 1, wherein said second capacitor has a greater capacitance value than the capacitance value of said first capacitor.

4. An offset-compensated filter circuit as claimed in claim 3, wherein $C_2/(C_1+C_2)$ is substantially equal to unity, where $C_1$ and $C_2$ are the capacitance values of said first and second capacitors, respectively.

* * * * *